(12) United States Patent
Slavov et al.

(10) Patent No.: US 8,222,722 B2
(45) Date of Patent: Jul. 17, 2012

(54) INTEGRATED CIRCUIT PACKAGE AND DEVICE

(75) Inventors: Nedyalko Slavov, Zurich (CH);
Heinz-Peter Wirtz, Dottingen (CH);
Thomas Villiger, Rotkreuz (CH);
Kwei-Kuan Kuo, Zurich (CH)

(73) Assignee: ST-Ericsson SA, Geneva (CH)

( * ) Notice: Subject to any disclaimer, the term of this patent is extended or adjusted under 35 U.S.C. 154(b) by 127 days.

(21) Appl. No.: 12/558,421

(22) Filed: Sep. 11, 2009

(65) Prior Publication Data

US 2011/0062576 A1 Mar. 17, 2011

(51) Int. Cl.
*H01L 23/02* (2006.01)
*H01L 23/48* (2006.01)
(52) U.S. Cl. .. 257/686; 257/780; 257/784; 257/E23.145
(58) Field of Classification Search .................. 257/686, 257/784, 780, E23.145, 786
See application file for complete search history.

(56) References Cited

U.S. PATENT DOCUMENTS

| | | | | |
|---|---|---|---|---|
| 6,777,799 B2 * | 8/2004 | Kikuma et al. | ............... | 257/686 |
| 6,815,789 B2 * | 11/2004 | Tiziani et al. | ................. | 257/459 |
| 6,930,378 B1 * | 8/2005 | St. Amand et al. | ........... | 257/686 |
| 7,453,159 B2 * | 11/2008 | Song et al. | ..................... | 257/786 |
| 7,572,680 B2 * | 8/2009 | Hess et al. | ..................... | 438/124 |
| 2003/0001287 A1 * | 1/2003 | Sathe | ............................. | 257/780 |
| 2003/0141582 A1 * | 7/2003 | Yang et al. | ..................... | 257/686 |
| 2003/0222344 A1 * | 12/2003 | Hosoyamada et al. | ....... | 257/738 |
| 2004/0173891 A1 * | 9/2004 | Imai et al. | ..................... | 257/686 |
| 2006/0220209 A1 * | 10/2006 | Karnezos et al. | ............ | 257/686 |
| 2007/0290376 A1 * | 12/2007 | Zhao et al. | .................... | 257/787 |

* cited by examiner

*Primary Examiner* — Nitin Parekh
(74) *Attorney, Agent, or Firm* — Potomac Patent Group PLLC

(57) ABSTRACT

An integrated circuit package including: a substrate having front connection pads on a front face, an integrated circuit die linked to the front face of the substrate and having front connection pads, connection wires for connecting selected front pads of the integrated circuit die to selected front pads of the substrate, first connection balls on selected front connection pads of the integrated circuit die, and second connection balls on selected front connection pads of the substrate. An integrated circuit device including a second substrate connected to the connection balls of the integrated circuit package.

21 Claims, 1 Drawing Sheet

INTEGRATED CIRCUIT PACKAGE AND DEVICE

BACKGROUND

1. Technical Field

The present disclosure relates to the field of integrated circuit devices or packages.

2. Description of the Related Art

Currently, on one hand, integrated circuit packages comprise a substrate, an integrated circuit die, bonding wires for connecting the die and the substrate and an block encapsulating the die and the wires, and, on the other hand, other integrated circuit packages comprise a substrate, an integrated circuit die, connection balls between the die and the substrate and an block encapsulating the die and the connection balls. In the both cases, the packages are connected to other substrates by connection balls on the faces of the substrates opposed to the integrated circuit dies.

BRIEF SUMMARY

It is proposed an integrated circuit package which can include a substrate having front connection pads on a front face, an integrated circuit die linked to the front face of the substrate and having front connection pads, connection wires for connecting selected front pads of the integrated circuit die to selected front pads of the substrate, first local connection means on selected front connection pads of the integrated circuit die, and second local connection means on selected front connection pads of the substrate.

The first local connection means and the second local connection means can be sized to be connected on connecting pads of another substrate.

The substrate can include a connection network connecting selectively the front pads thereof.

It is proposed an integrated circuit device, which can include a first substrate, an integrated circuit die linked to the first substrate, connection wires for connecting the die to the first substrate, a second substrate, first local connection means between the integrated circuit die and the second substrate, and second local connection means between the first substrate and the second substrate.

The integrated circuit die can include central connection pads connected to the first connection balls and peripheral connection pads connected to the connection wires.

The first substrate can include first connection pads around the periphery of the integrated circuit die and connected to the connection wires and second connection pads around the periphery of the first connection pads and connected to the second local connection means.

The second substrate can be a printed circuit board.

An integrated circuit device can further include a third substrate and third local connection means between the second substrate and the third substrate.

The third substrate can be a printed circuit board.

The first substrate can comprise connection pads on a face opposed to the integrated circuit die.

BRIEF DESCRIPTION OF THE SEVERAL VIEWS OF THE DRAWINGS

Other advantages and features will become apparent by studying integrated circuit systems, described by way of non-limited examples and illustrated by the appended drawings in which.

DETAILED DESCRIPTION

Figure 1:
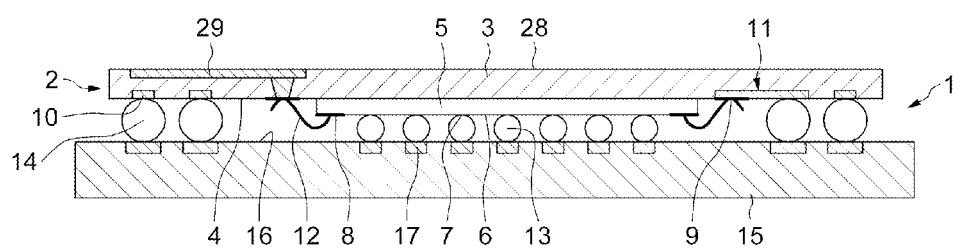
FIG. 1 represents a cross-section of an integrated circuit device.

Referring to FIG. 1, an integrated circuit device 1 as shown includes an integrated circuit package 2.

This integrated circuit package 2 comprises a first substrate 3 having a front face 4 and an integrated circuit die 5 linked to a central part of the front face 4 for example by the intermediate of a glue. The front face 6 of the die is substantially parallel to the front face 4 of the first substrate 3. The front face 6 of the die is provided with connection pads which include a group of central connection pads 7, as flip-chip bumps, and a group of peripheral connection pads 8, as bonding pads.

The front face 4 of the substrate 3 is provided with a first group of inner connection pads 9 placed around and at a distance from the periphery of the die 5 and a second group of outer connection pads 10 placed around the first group of connection pads 9. The first substrate includes a connection network 11 adapted to connect selectively the connection pads 9 and the connection pads 10

The integrated circuit package 2 comprises further a group of connection bonding wires 12 connecting selectively the peripheral connection pads 8 of the integrated circuit die 5 to the inner connection pads 9 of the first substrate 2, a first group of central local connection means such as connection balls 13 on the central connection pads 7 of the integrated circuit die 5 and a second group of peripheral local connection means such as connection balls 14 on the outer connection pads 10 of the substrate 2. the local connection means would be also in form of copper pillars or gold bond wires.

The integrated circuit device 1 includes further a second substrate 15 having a face 16 providing with connection pads 17 placed respectively to receive and to be connected to the connection balls 13 and the connection balls 14. The second substrate 15 can include a connection network connected to the connection pads 17 to be connected to other electronic circuits.

For example, the face 16 of the second substrate 15 is substantially parallel to the front face 4 of the first substrate 3 and the connection pads 17 can be in a same plane. Consequently, the diameter of the balls 14 is approximately equal to the thickness of the die plus the diameter of the balls 13, so that, before assembling, the parts of the balls 13 and of the balls 14, opposed to the front face 4 of the first substrate 3, are in a same plane.

The bonding wires 12 are adapted in order that they are not in contact with the second substrate 15.

For example, the second substrate 15 can be a printed circuit board carrying other components connected to the connection pads 17 thereof.

In consequence of the above structure, the integrated circuit die 5 can be connected to the connection pads 17 of the second substrate 15 on one hand directly by the intermediate of the connection balls 13 and on the other hand by the intermediate of the wires 12, the connection network 11 of the first substrate 3 and the connection balls 14. So, it is possible to choice selectively the using of these connections.

Figure 2:
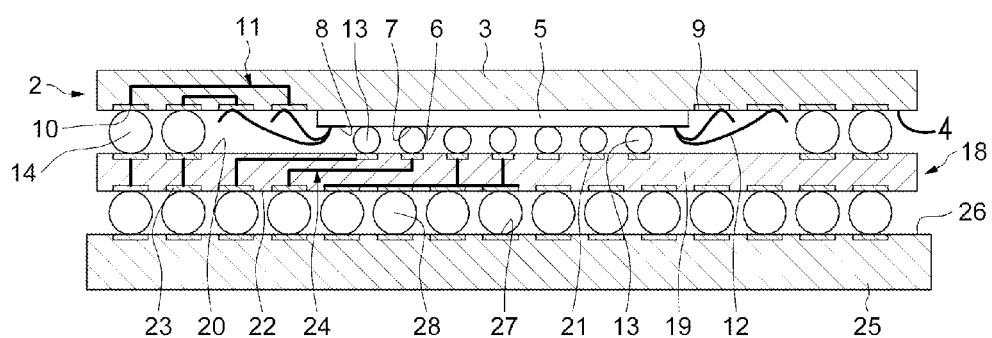
FIG. 2 represents a cross-section of another integrated circuit device.

Referring to FIG. 2, another integrated circuit device 18 as shown includes also an integrated circuit package 2 and includes a second substrate 19 having a face 20 provided with connection pads 21 connected to the connection balls 13 and 14 as above-described.

A face 22 of the second substrate 19, opposed to the face 20 thereof, is provided with connection pads 23.

The second substrate 19 includes an integrated connection network 24 for connecting respectively the connection pads 21 of the face 20 and the connection pads 23 of the face 22.

The integrated circuit device 18 comprises further a third substrate 25 having a face 26 provided with connection pads 27 and local connection means such as connection balls 28 placed between the connection pads 23 of the second substrate 19 and the connection pads 27 of the third substrate 25.

As above-described concerning the second substrate 15, the third substrate 24 can be a printed circuit board.

In the example of FIG. 1, on one hand, as the central connection balls 13 are smaller than the peripheral connection balls 14, the pitch of the central connection balls 13, which can be fine, is smaller than the pitch of the peripheral connection balls 14 and, on the other hand, due to the existence of the necessary place for the wires 12, the central connection balls 13 and the peripheral connection balls 14 are spaced apart. In consequence, the disposition of the connection pads 17 of the second substrate 15, which can be a printed circuit board, is in correspondence of this disposition of the connection balls 13 and 14.

In the example of FIG. 2, the existence of the second substrate 19 between the integrated circuit package 2 and the third substrate 25, which can be a printed circuit board, can permit to transform the irregular disposition of the connection balls 13 and 14 into a regular disposition of the connection balls 27, according to a regular pitch adapted to such a printed circuit board.

As shown particularly on FIG. 1, the rear face 28 of the first substrate 3, opposed to the front face 4 thereof, can be provided of connection pads 29 connected to the network 11. This disposition can permit to equip the devices with other components linked on the rear face 28 of the first substrate 3. Furthermore, the rear face 28 of the first substrate can be used for thermal dissipation.

Although embodiments of the devices and systems of the present disclosure have been illustrated in the accompanying drawings and described in the foregoing detailed description, it will be understood that the disclosure is not limited to the embodiments disclosed, but is capable of numerous rearrangements, modifications and substitutions without departing from the spirit of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit package, comprising:
a first substrate having first and second connection pads on a face,
an integrated circuit die on the face of the first substrate and having first and second connection pads,
connection wires connecting the first connection pads of the integrated circuit die to the first connection pads of the first substrate,
first local connectors on the second connection pads of the integrated circuit die, and
second local connectors on the second connection pads of the first substrate, wherein the first substrate includes a conductive connection network electrically connecting at least one of the first connection pads of the first substrate with at least one of the second connection pads of the first substrate.

2. An integrated circuit package according to claim 1, wherein the first local connectors and the second local connectors are sized to be connected on connecting pads of a face of a second substrate.

3. An integrated circuit package according to claim 1, further comprising an adhesive layer between the integrated circuit die and the first substrate.

4. An integrated device, comprising:
a first substrate,
an integrated circuit die on the first substrate,
connection wires for connecting the die to the first substrate,
a second substrate,
first local connectors between the integrated circuit die and the second substrate, and
second local connectors between the first substrate and the second substrate, wherein the first substrate includes a connection network connecting at least one of the first connection pads of the first substrate with at least one of the second connection pads of the first substrate.

5. An integrated circuit device according to claim 4, in which the integrated circuit die includes central connection pads connected to the first local connectors and peripheral connection pads connected to the connection wires.

6. An integrated circuit device according to claim 4, in which the first substrate includes first connection pads around a periphery of the integrated circuit die and connected to the connection wires and second connection pads around a periphery of the first connection pads and connected to the second local connectors.

7. An integrated circuit device according to claim 4, in which the second substrate is a printed circuit board.

8. An integrated circuit device according to claim 4, including further a third substrate and third local connectors between the second substrate and the third substrate.

9. An integrated circuit device according to claim 8, in which the third substrate is a printed circuit board.

10. An integrated circuit device according to claim 4, in which the first substrate comprises connection pads on a face opposed to the integrated circuit die.

11. An integrated circuit device according to claim 4, further comprising an adhesive layer between the integrated circuit die and the first substrate.

12. An integrated circuit device, comprising:
an integrated circuit package including:
a first substrate having first and second connection pads on a first face,
an integrated circuit die on the first face of the first substrate and having first and second connection pads,
connection wires connecting the first connection pads of the integrated circuit die to the first connection pads of the first substrate,
first local connectors on the second connection pads of the integrated circuit die, and
second local connectors on the second connection pads of the first substrate; and
a second substrate having first and second connection pads positioned on a first face of the second substrate, third and fourth connection pads positioned on a second face of the second substrate, first internal connectors connecting the first and third connection pads of the second substrate to each other, and second internal connectors connecting the second and fourth connection pads of the second substrate to each other, the second face of the second substrate being on an opposite side of the second substrate with respect to the first face of the second substrate, the first connection pads being connected to the first local connectors, and the second connection pads being connected to the second local connectors.

13. An integrated circuit device according to claim 12, in which the first connection pads of the integrated circuit die include central connection pads connected to the first local connectors and the second connection pads of the integrated circuit include peripheral connection pads connected to the connection wires.

14. An integrated circuit device according to claim 12, in which the first connection pads of the substrate are positioned around a periphery of the integrated circuit die and the second connection pads of the substrate are positioned around a periphery of the first connection pads.

15. An integrated circuit device according to claim 12, including:
    a third substrate having fifth connection pads; and
    third local connectors electrically connecting the fifth connection pads of the third substrate to the third and fourth connection pads of the second substrate.

16. An integrated circuit device according to claim 15, in which the third substrate is a printed circuit board.

17. An integrated circuit device according to claim 12, in which the first substrate comprises third connection pads on a second face opposite to the first face.

18. An integrated circuit device according to claim 12, further comprising an adhesive layer between the integrated circuit die and the first substrate.

19. An integrated circuit device, comprising:
    a first substrate having connection pads;
    a second substrate having first and second connection pads positioned on a first face of the second substrate, third and fourth connection pads positioned on a second face of the second substrate, first internal connectors connecting the first and third connection pads to each other, and second internal connectors connecting the second and fourth connection pads to each other, the second face being on an opposite side of the second substrate with respect to the first face;
    first electrical connectors connecting the first and second connection pads of the second substrate to the connection pads of the first substrate;
    a third substrate having a face and first connection pads on the face of the third substrate;
    an integrated circuit die on the face of the third substrate and having first connection pads;
    second electrical connectors connecting the first connection pads of the integrated circuit die to the third connection pads of the second substrate; and
    third electrical connectors connecting the first connection pads of the third substrate to the fourth connection pads of the second substrate.

20. An integrated device according to claim 19, wherein the third substrate has second connection pads on the face of the third substrate and the integrated circuit die has second connection pads, the integrated circuit device comprising:
    connection wires connecting the second connection pads of the integrated circuit die to the second connection pads of the first substrate.

21. An integrated circuit device according to claim 20, wherein the third substrate includes internal connectors connecting the first and second connection pads of the third substrate to each other.

* * * * *